(12) United States Patent
Ng et al.

(10) Patent No.: US 8,067,797 B2
(45) Date of Patent: Nov. 29, 2011

(54) VARIABLE THRESHOLD TRENCH IGBT WITH OFFSET EMITTER CONTACTS

(75) Inventors: Chiu Ng, El Segundo, CA (US);
Yuan-Heng Chao, San Jose, CA (US)

(73) Assignee: International Rectifier Corporation, El Segundo, CA (US)

( * ) Notice: Subject to any disclaimer, the term of this patent is extended or adjusted under 35 U.S.C. 154(b) by 289 days.

(21) Appl. No.: 12/252,684

(22) Filed: Oct. 16, 2008

(65) Prior Publication Data

US 2009/0146177 A1 Jun. 11, 2009

Related U.S. Application Data

(60) Provisional application No. 60/999,240, filed on Oct. 17, 2007.

(51) Int. Cl.
*H01L 29/66* (2006.01)
(52) U.S. Cl. ........... 257/330; 257/397; 257/E29.066; 257/E29.198
(58) Field of Classification Search .......... 257/376, 257/396, 119, 270, 328–334, 300, E29.136, 257/E29.131, E29.066, E29.198, E29.197
See application file for complete search history.

(56) References Cited

U.S. PATENT DOCUMENTS

| | | | | |
|---|---|---|---|---|
| 5,679,966 A | * | 10/1997 | Baliga et al. | 257/139 |
| 6,072,214 A | * | 6/2000 | Herzer et al. | 257/331 |
| 6,683,331 B2 | | 1/2004 | Francis | 257/163 |
| 6,861,702 B2 | * | 3/2005 | Kitamura | 257/330 |
| 7,619,280 B2 | * | 11/2009 | Cao et al. | 257/330 |
| 2002/0020873 A1 | * | 2/2002 | Klodzinski | 257/328 |
| 2004/0178441 A1 | * | 9/2004 | Yanagisawa | 257/327 |
| 2004/0232481 A1 | * | 11/2004 | Herrick et al. | 257/330 |
| 2005/0006700 A1 | * | 1/2005 | Cao | 257/328 |
| 2007/0063269 A1 | | 3/2007 | Ng | 257/330 |
| 2008/0087952 A1 | * | 4/2008 | Pfirsch | 257/334 |
| 2009/0008674 A1 | * | 1/2009 | Udrea | 257/138 |

OTHER PUBLICATIONS

International Search Report dated Dec. 22, 2008.

* cited by examiner

*Primary Examiner* — Matthew Landau
*Assistant Examiner* — Latanya N Crawford
(74) *Attorney, Agent, or Firm* — Farjami & Farjami LLP

(57) ABSTRACT

A trench type IGBT as disclosed herein includes a plurality of channel regions having one threshold voltage for the normal operation of the device and a plurality of channel regions having a threshold voltage higher than the threshold voltage for the normal operation of the device.

14 Claims, 4 Drawing Sheets

VARIABLE THRESHOLD TRENCH IGBT WITH OFFSET EMITTER CONTACTS

CROSS-REFERENCE TO RELATED APPLICATION

The present application is based on and claims priority to U.S. Provisional Patent Application Ser. No. 60/999,240, filed on Oct. 17, 2007 and entitled VARIABLE THRESHOLD TRENCH IGBT WITH OFFSET EMITTER CONTACTS, the entire disclosure of which is hereby incorporated by reference.

FIELD OF INVENTION

The present invention relates to a technique for designing and fabricating a trench IGBT (insulated gate bipolar transistor) to increase device robustness in motor drive inverters among other applications and an IGBT fabricated according to the method.

BACKGROUND AND SUMMARY OF THE INVENTION

In industrial motor drive applications, an IGBT with a long short-circuit withstand time (SCSOA) is required. The withstand time represents how long the IGBT can stay functional and be turned off after encountering a motor fault condition where the IGBT conducts under full bus voltage (collector-emitter voltage). The withstand time is required for the driver to detect and locate the failure and turn off the system without further damage.

FIG. 1 depicts a short-circuit waveform with associated failure mechanisms A, B, C, and D. Failure types A, B and C are primarily due to parasitic thyristor latch-up. Type D is due to leakage current thermal runaway, which occurs a few hundred microseconds after device turn-off Most of today's IGBTs are designed to be latch-up immune with type D being the only failure mechanism limiting SCSOA. Since type D failure is thermally limited, SCSOA of today's IGBTs is thermally limited. The SCSOA of the IGBT can hence be improved by the following:

1) increase in silicon wafer thickness to increase over thermal mass; and/or
2) saturation current reduction.

FIG. 2 shows the dependence of short-circuit withstand time on bus voltage and saturation current. Note that, 1) SCSOA decreases with higher voltage;
2) SCSOA decreases with higher saturation current.

IGBT saturation current is highly dependent on the gate drive voltage as well as the overall MOS channel density. It should be noted that 1) saturation current increases with higher gate drive;
2) saturation current increases with higher channel density.

Channel density is inversely proportional to the cell pitch of the design. Where cell pitch is defined as the distance from one trench to the next. The wider the cell pitch, the lower the channel density and hence the lower the saturation current.

In today's motor drive applications, on-state saturation voltage reduction is as important as switching loss reduction. Methods to lower on-state saturation voltage drop include, 1) enhancement implant—increase in base drive electron injection efficiency;
2) deeper trenches—decrease in accumulation layer resistance at the tip of the trench;
3) wafer thinning—decrease in drift region resistance.

Large SCSOA demands wider cell pitch. Forward bias breakdown requires narrow cell pitch.

In order to achieve the desired channel density and breakdown voltage, narrow cell pitch is needed to reduce field crowding in which only a portion of the channels are conducting. One method for obtaining a desirable combination of channel density and breakdown voltage is shorting every other trench poly gate to emitter. Shorting gate to emitter eliminates gate drive completely for specific trenches, effectively reducing the overall channel density of the device while maintaining a narrow cell pitch to achieve the desired breakdown voltage. A structure using the latter method has been published in ISPSD 2006 by Mitsubishi, which has been defined as a damping trench for eliminating switching oscillations.

According to the present invention the saturation current of the IGBT is reduced in a unique manner to achieve the desired SCSOA. Specifically, according to the present invention, the threshold voltage of the channel at some of the trenches (e.g. every other trench) is increased.

In an IGBT (e.g. an N channel IGBT), P+ emitter contact regions are used to enhance parasitic thyristor latch-up. Such contact regions are formed in the base region and are higher in dosage (i.e. lower resistivity) compared to the P type base region in which the N channels are formed. A method according to the present invention allows the contact implant to contaminate some of the channel regions to increase the threshold voltage thereof For example, by decreasing contact to trench spacing in the mask used for the emitter contact implant the emitter contacts can be selectively offset and asymmetrically positioned relative to, for example, two opposing trenches. As a result, the channel region adjacent one trench can have a higher dopant concentration and thus a higher threshold voltage.

DETAILED DESCRIPTION OF THE EMBODIMENTS

Figure 3:
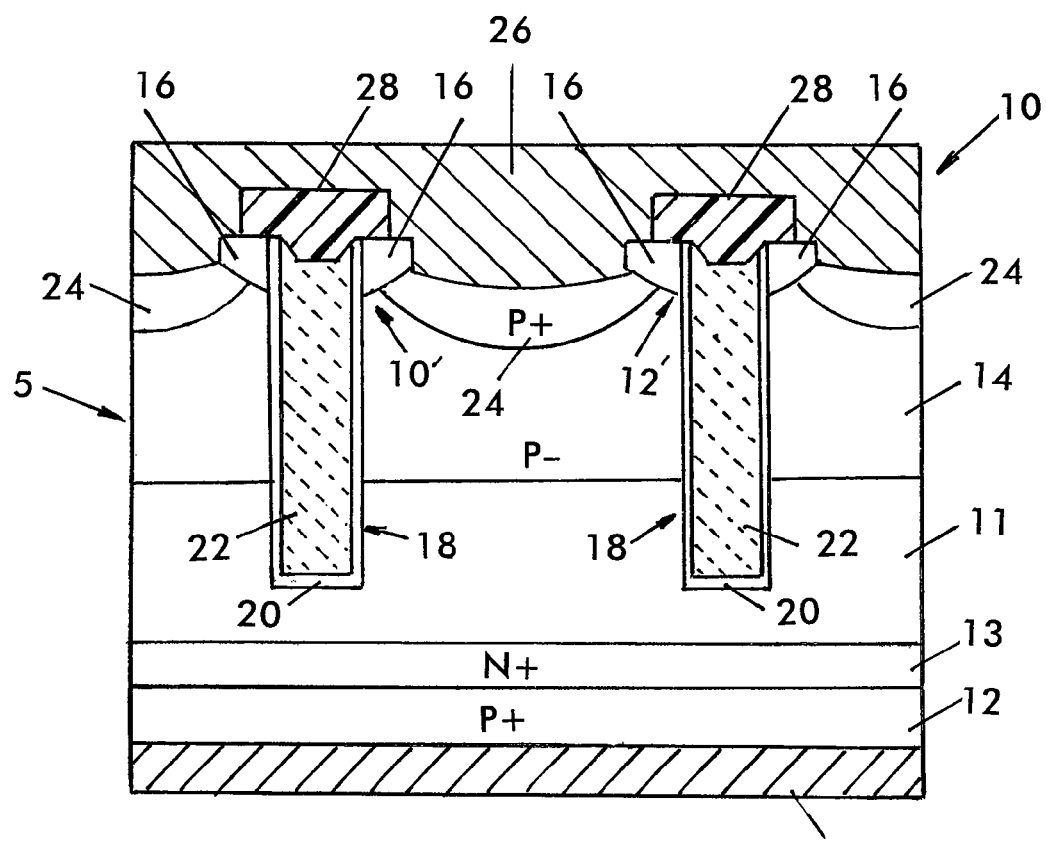
FIG. 3 illustrates an active cell of an IGBT according to an embodiment of the present invention.

Referring to FIG. 3, a semiconductor device 10 according to the present invention is an IGBT that comprises semiconductive body 5 which includes first region 14 (base region) of a first conductivity type, e.g. P type, disposed over second region 11 (drift region) of a second conductivity type, e.g. N type, and diffused regions 16 (emitter regions) of the second conductivity type. Emitter regions 16 are formed in base region 14 adjacent to opposing walls of trenches 18, which extend from the top surface of semiconductive body 5 to a depth that is below the depth of base region 14. Each trench 18 is lined with a thin gate insulation layer 20, for example, a silicon dioxide layer, and filled with a conductive gate material 22, such as, conductive polysilicon, to form an insulated gate structure.

Semiconductor device 10 also includes high conductivity emitter contact regions 24 of the first conductivity type which extend to a predetermined depth into base region 14. Emitter contact regions 24 have a lower resistivity (higher dopant dosage) than base region 14. Semiconductor device 10 further includes emitter contact 26, which is in electrical contact with high conductivity emitter contact regions 24 and emitter regions 16, and collector contact 30. Collector contact 30 is in direct electrical contact with conductivity modulating region 12, which is of the first conductivity type. Buffer region 13, which is of the same conductivity type as, but higher concentration than the drift region 11 is disposed between drift region 11 and conductivity modulating region 30. Conductivity modulating region 12 injects carriers into the drift region which results in improving the overall conductivity of the device during operation. Buffer region 13 improves the turn-off speed of the device by reducing the injection rate of the carriers into the drift region and increasing the recombination rate during a switching cycle.

Conductive gate material 22 in each trench 18 is electrically isolated from emitter contact 26 by a respective insulation plug 28. Conductive gate material 22 in each trench is electrically connected to a gate contact (not shown) such that the application of an appropriate bias to the gate contact will cause inversion in those portions of base region 14 adjacent to trenches 18 (channel regions) to enable conduction between emitter contact 26 and collector contact 30.

Figure 1:
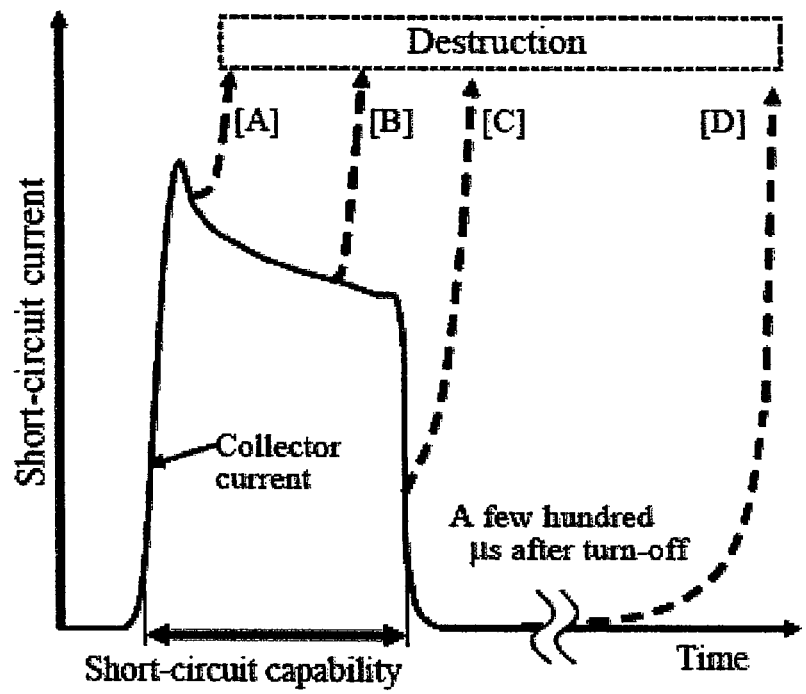
FIG. 1 depicts a short circuit waveform and associated failure modes for a typical IGBT FIG. 2 graphically illustrates the relationship of short-circuit withstand time, the bus voltage and saturation current.
Figure 2:
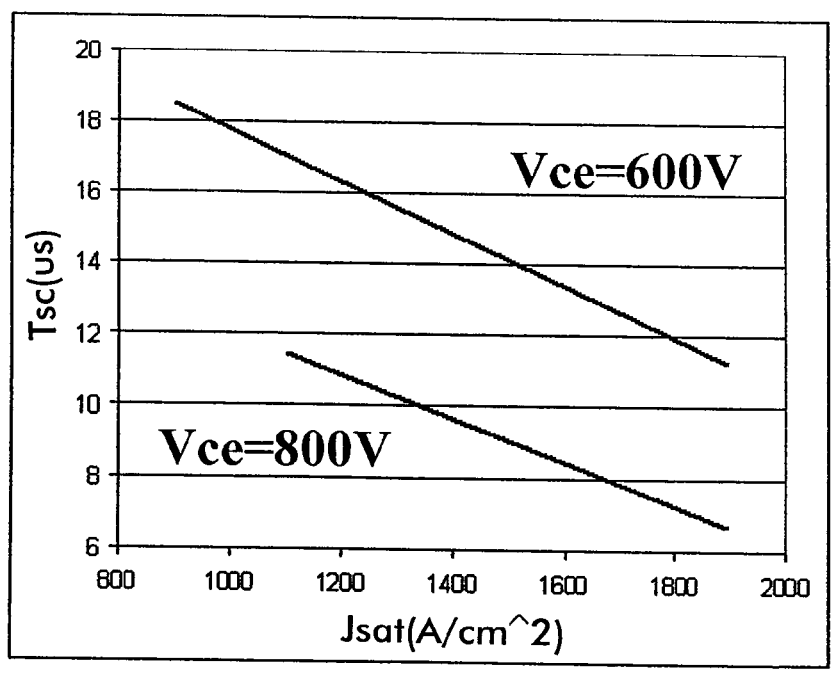

Semiconductive body 5 in the embodiment shown by FIG. 1 may be comprised of an epitaxially grown semiconductive layer which is formed over a top surface of a float zone monocrystalline semiconductive substrate. Preferably, conductivity modulating region 12 and buffer region 13 are formed in the float zone monocrystalline semiconductive portion of semiconductive body 5, while the remaining features of semiconductor device 10 are formed in the epitaxially grown semiconductive layer. Alternatively, semiconductive body 5 may be comprised entirely of float zone monocrystalline semiconductive material such as monocrystalline silicon.

In an IGBT according to the present invention, invertible channel regions in the base region 14 adjacent trenches 18 can be selectively doped to have different threshold voltages. Thus, a channel region 10' is a regular channel (i.e. a channel meant for conduction during ordinary operation of the device) and can have a threshold voltage which is selected for ordinary device switching operation (i.e. device threshold voltage), and channel region 12' on the right is a high threshold channel region.

In the preferred embodiment, to obtain channel region 12', emitter contact region 24 is asymmetically positioned relative to two opposing trenches 18 such that it is closer to one trench 18 than the other trench. As a result, emitter contact 24 encroaches into what normally would be a regular channel region 10' and increase the concentration of the dopants therein. Consequently, the threshold voltage of channel region 12' is higher than channel region 10'. Thus, by selectively increasing the threshold voltage at some channel locations in the device the amount of current flowing through the channel is at a minimum, which effectively reduces the overall channel density.

Figure 4A:
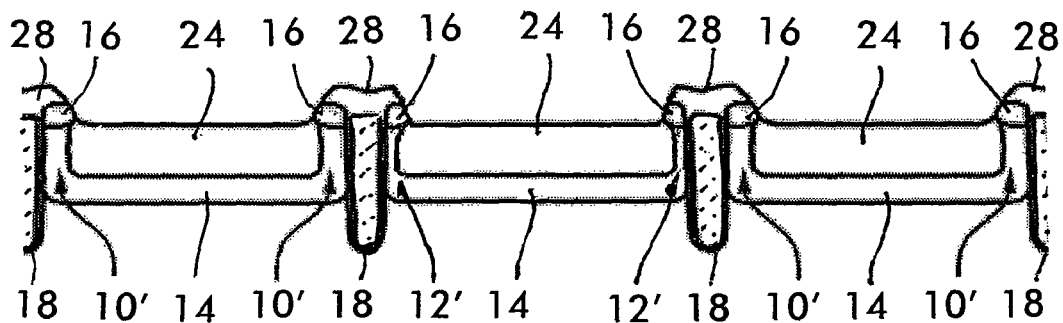
FIGS. 4A-4D illustrate four alternative embodiments of the present invention.

A device according to the present invention can be implemented in a number of different ways. Thus, in one embodiment as illustrated by FIG. 4A, a trench may include a channel region 10' at one sidewall thereof and a channel region 12' at another opposing sidewall thereof No that in this embodiment, base region 14 between two opposing trenches 18 can include channel region 12' only at one location and channel regions 10' at other locations.

Figure 4B:
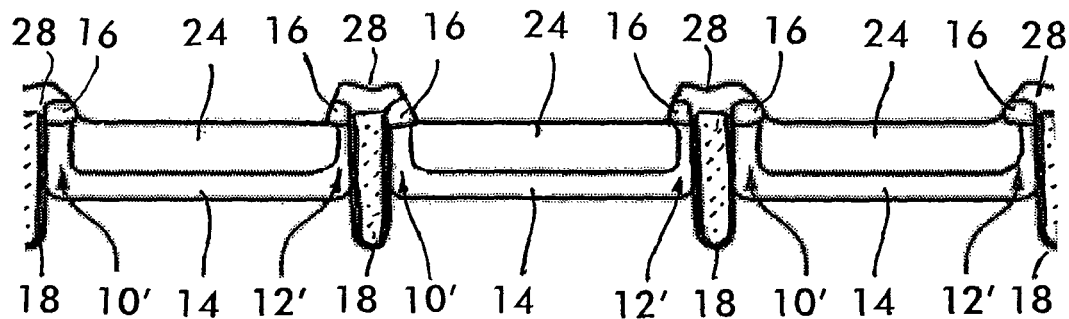

In another embodiment as illustrated by FIG. 4B, each trench can include a channel region 10' at one sidewall thereof and a channel region 12' at another sidewall thereof Thus, in the embodiment shown by FIG. 4B, base region 14 between two opposite trenches can include a channel region 10' and a channel region 112'.

Figure 4C:
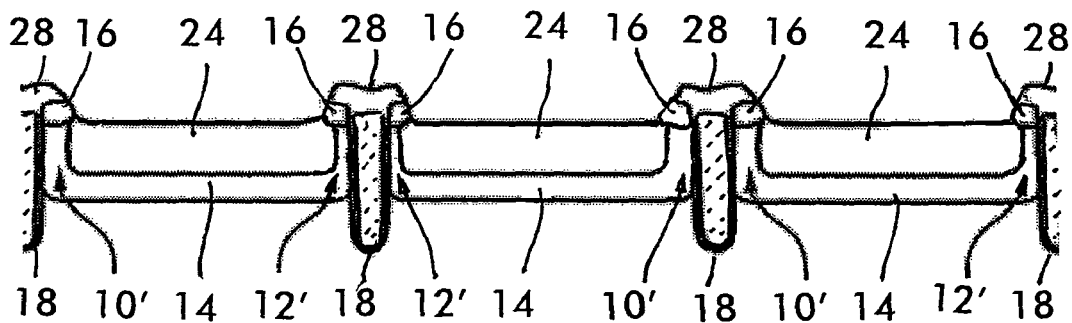
Figure 4D:
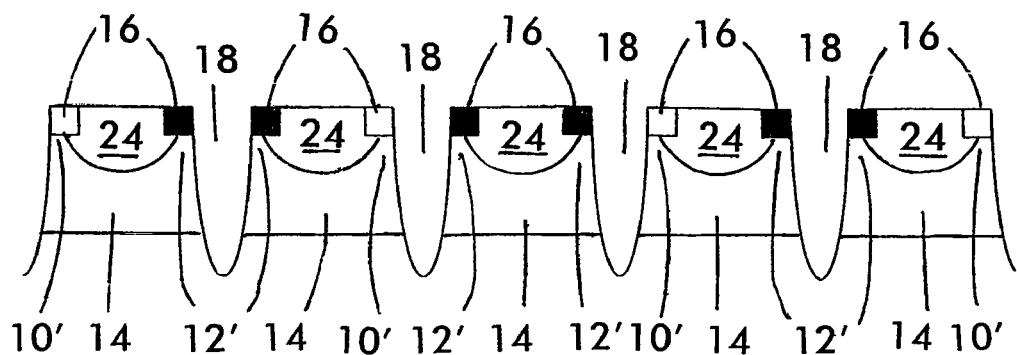

Referring to FIG. 4C, in another embodiment, some of the trenches can include a channel region 12' at one sidewall thereof and another channel region 12' at another sidewall thereof while other trenches can include a channel region 10' at one sidewall thereof and another channel region 10' at another sidewall thereof Referring to FIG. 4D, in yet another embodiment, some of the trenches can include a channel region 10' at one sidewall thereof and a channel region 12' at another sidewall thereof and a channel region 12' at one sidewall thereof and another channel region 12' at another sidewall thereof Additional embodiments may include channel regions of multiple threshold voltages. Thus, for example, different emitter contact region 24 (and emitter contact) to trench spacings would result in channel regions with different threshold voltages. As a result, a gradient of channel regions of different threshold voltages can be obtained in order to have better control over the current distribution within the die.

Figure 5:
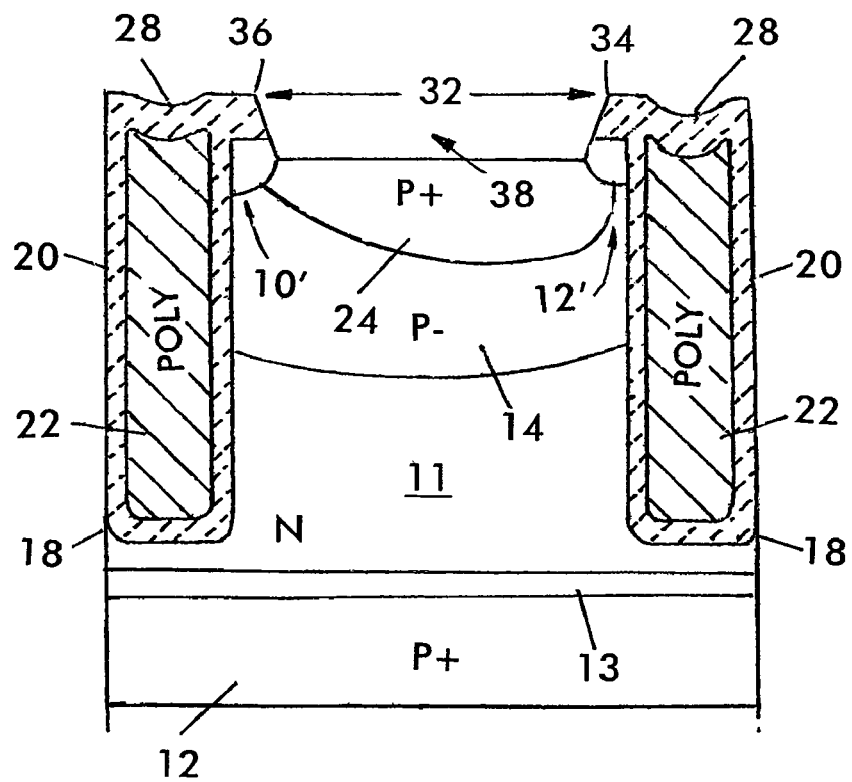
FIG. 5 illustrates a step in the fabrication of a device according to the present invention.

Referring now to FIG. 5, to fabricate a device according to the present invention, after forming features of an IGBT device according to any preferred method (e.g. after forming base region 16, emitters 14, gate trenches 22, gate insulation 24, and gate electrodes 20) a window 32 can be provided for implanting dopants to form emitter contact regions 24. Specifically, for example, an insulation body is formed over the top end of trenches 22 and patterned to obtain openings 32 between two opposing trenches. According to one aspect of the present invention, window 32 is offset; i.e. is not symmetrically positioned relative to trenches 22. Thus, one sidewall 34 of window 32 is closer to its adjacently disposed trench than the other sidewall 36 thereof The position of sidewall 34 is selected so that once dopants for forming emitter contact region 24 are implanted and driven in a diffusion drive, a channel 12' having a high threshold voltage is obtained therebelow according to the present invention.

Thus, for example, after window 32 is opened dopants for forming emitter contact region 24 are implanted into base region 14 through window 32, and then driven to obtain a region 24, channel region 10' of one threshold (e.g. device threshold), and channel region 12' of another higher threshold according to the present invention. Thereafter, emitter metal contact is deposited by sputtering or the like to obtain a device according to the present invention. Thus, in a method for fabrication of a device according to the present invention, a channel having a high threshold voltage can be attained by decreasing trench to contact spacing in the masking design and purposely allowing contact implant dose to encroach into the channel region. Note that optionally, a recess 38 may be formed into base region 16 either prior to or after implantation of dopants to form emitter contact region 24 therein.

Thus, in a device according to the present invention a number of channel regions adjacent the trenches are configured to have high thresholds to effectively reduce overall channel density while maintaining the desired narrow cell pitch to meet breakdown;

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An IGBT comprising:
a semiconductor body that includes a top surface and a bottom surface, and a drift region of one conductivity type;
a base region of another conductivity type over said drift region;
a plurality of trenches extending through said base region into said drift region, emitter regions adjacent said trenches; and
an insulated gate electrode inside each of said trenches, wherein each trench includes a channel region adjacent a respective sidewall thereof which upon application of a respective threshold voltage can be converted to a channel connecting an adjacently disposed emitter region and said drift region, and wherein at least a first group of said channel regions requires a first threshold voltage and at least a second group of said channel regions requires a second threshold voltage, said first threshold voltage is a device threshold voltage and said first threshold voltage and said second threshold voltage have different magnitudes and the same polarity; and
wherein threshold voltages are different for each of said plurality of trenches.

2. The IGBT of claim 1, wherein said second threshold voltage is greater than said first threshold voltage.

3. The IGBT of claim 1, wherein at least one of said trenches includes a channel region from said first group of said channels adjacent one sidewall thereof and a channel region from said second group of said channels adjacent another sidewall thereof.

4. The IGBT of claim 1, wherein at least one of said trenches includes a channel region from said second group of said channels adjacent one sidewall thereof and a channel region from said second group of said channels adjacent another sidewall thereof.

5. The IGBT of claim 1, wherein at least one of said trenches includes a channel region from said first group of said channels adjacent one sidewall thereof and a channel region from said second group of said channels adjacent another sidewall thereof and at least another one of said trenches includes a channel region from said second group of said channels adjacent one sidewall thereof and a channel region from said second group of said channels adjacent another sidewall thereof.

6. The IGBT of claim 1, further comprising a contact region of said another conductivity type and lower resistivity than said base region disposed between and asymmetrically positioned between at least two of said trenches, said contact region having a channel region of the first group of said channel region adjacent one side thereof, and a channel region from the second group of said channel region adjacent another side thereof.

7. The IGBT of claim 1, further comprising a contact region of said another conductivity type and lower resistivity than said base region positioned between at least two of said trenches, said contact region having a channel region of said second group of said channel region adjacent one side thereof, and a channel region from said second group of said channel region adjacent another side thereof.

8. A trench type IGBT comprising:
a plurality of gate trenches extending through a base region of a first conductivity type into a drift region of a second conductivity type;
a channel region extending along a sidewall of each of said plurality of gate trenches from a respective emitter region adjacent each gate trench to said drift region;
wherein a threshold voltage required to form an inverted channel in said channel regions varies for channel regions adjoining the same gate trench and for channel regions adjoining adjacent gate trenches.

9. The IGBT of claim 8, wherein said channel regions comprise a first group of channel regions requiring a first threshold voltage and a second group of channel regions requiring a second threshold voltage, and wherein said first and second threshold voltages have different magnitudes and the same polarity.

10. The IGBT of claim 9, wherein at least one of said gate trenches has a sidewall adjacent a channel region of said first group of channel regions and a second sidewall adjacent a channel region of said second group of channel regions.

11. The IGBT of claim 9, wherein said first threshold voltage is a device voltage, and wherein at least one of said gate trenches has opposite sidewalls each adjacent a channel region of said second group of channel regions.

12. The IGBT of claim 9, further comprising a contact region of said first conductivity type and having lower resistivity than said base region disposed between at least two of said gate trenches, said contact region having a channel region of said first group of channel regions adjacent one side thereof, and a channel region of said second group of channel regions adjacent another side thereof.

13. The IGBT of claim 9, further comprising a contact region of said first conductivity type and having lower resistivity than said base region disposed between at least two of said trenches, said contact region having channel regions of said second group of channel regions adjacent opposite sides thereof.

14. The IGBT of claim 12, wherein said contact region is asymmetrically disposed between said at least two of said gate trenches.

* * * * *